(12) United States Patent
Thomsen

(10) Patent No.: US 6,203,356 B1
(45) Date of Patent: Mar. 20, 2001

(54) DEVICE AND METHOD FOR PROTECTING PINS OF AN ELECTRICAL COMPONENT

(75) Inventor: Peter Thomsen, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/260,282

(22) Filed: Mar. 2, 1999

(51) Int. Cl.[7] .................................................. H01R 13/64
(52) U.S. Cl. ............................................................ 439/381
(58) Field of Search ..................................... 439/381, 140, 439/149, 150, 378

(56) References Cited

U.S. PATENT DOCUMENTS 5,348,488 * 9/1994 Green et al. .......................... 439/381
5,466,164 * 11/1995 Miyazaki et al. .................... 439/140

* cited by examiner

*Primary Examiner*—Gary F. Paumen
(74) *Attorney, Agent, or Firm*—Felsman, Bradley, Vaden, Gunter & Dillon, LLP.

(57) ABSTRACT

An apparatus having a thin metal frame has an opening and a protective rail on each end. Four guide posts extend from the lower surface of the frame to a plate which is spring-biased away from the frame. The plate has pin holes which are arrayed for a particular electrical component having contact pins. The component is loaded into the apparatus by extending the pins through the opening and into the pin holes in the plate. The rails may be flexed outward to accommodate the component before snapping onto and around the ends of the component to fix it from movement relative to the apparatus. The guide posts extend beyond the tips of the pins to provide stand-off protection. The tips of the guide posts are placed in a socket and the assembly is pressed into the socket until the pins seat in it. As the pins are inserted into the socket, the plate is pressed toward the frame to collapse the springs. The apparatus is left permanently installed with the component in the socket.

12 Claims, 1 Drawing Sheet

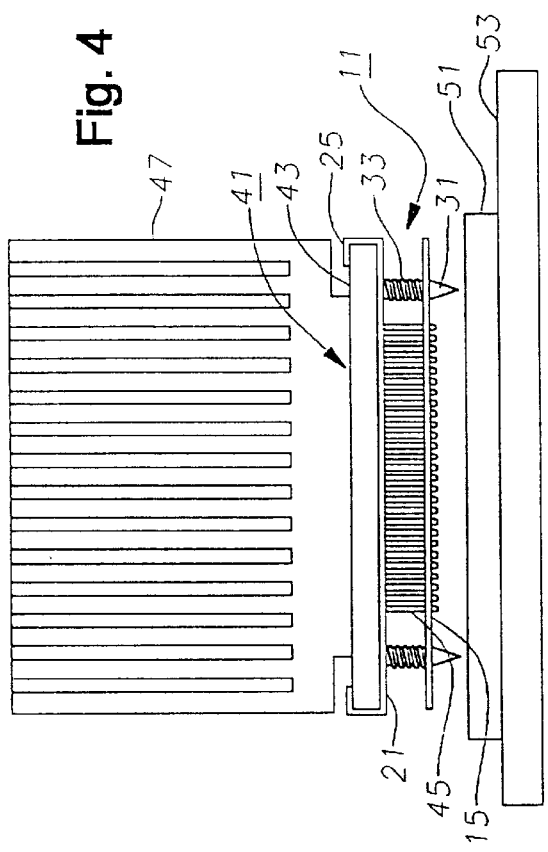
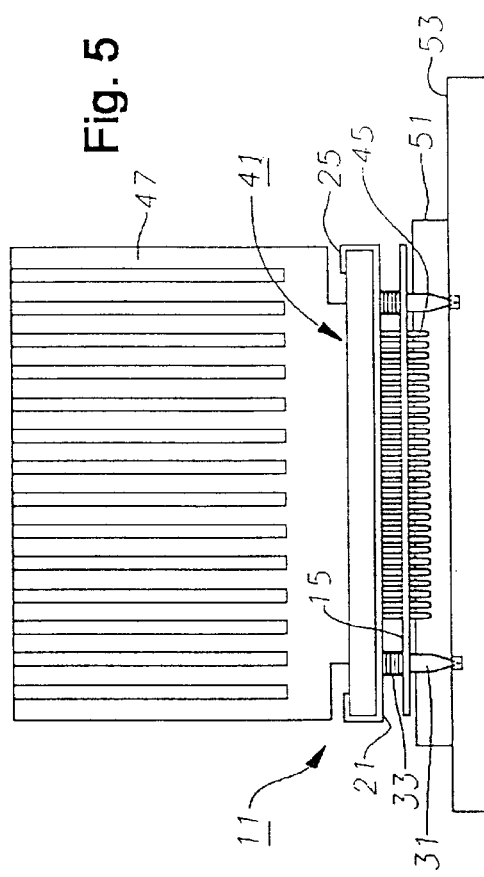
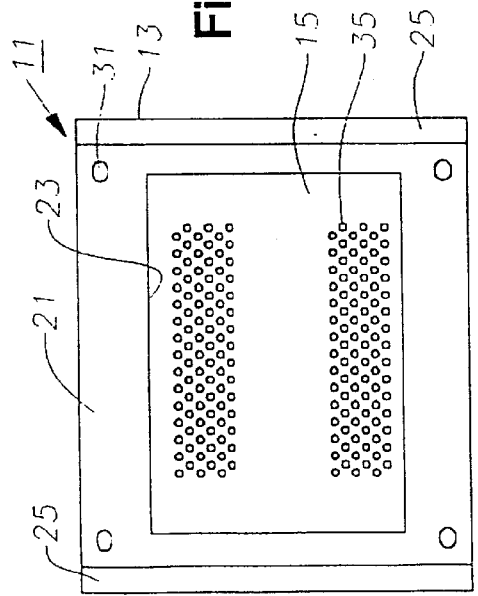
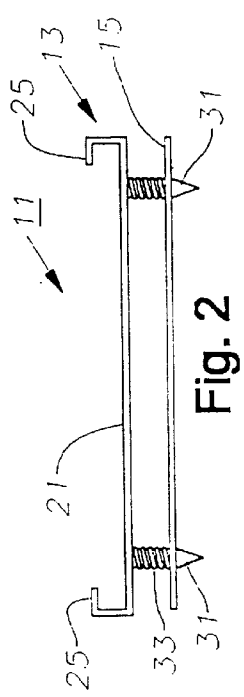
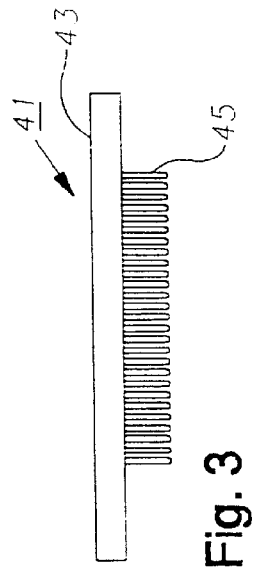

DEVICE AND METHOD FOR PROTECTING PINS OF AN ELECTRICAL COMPONENT

TECHNICAL FIELD

This invention relates in general to electrical components with pin contacts and in particular to a device and method for protecting the pin contacts of an electrical component.

BACKGROUND ART

Electrical components such as modules with pin-in-hole (PIH) packaging, typically have a module body with a plurality of straight, electrical contact pins extending from its lower surface. During the handling and installation of the module in a mating socket, the pins can be bent or otherwise damaged by incidental contact or by mishandling by unskilled persons. In such instances, the module is often permanently damaged and must be discarded. This source of waste can significantly increase manufacturing costs as the module typically represents a relatively expensive portion of the final product. A simple, inexpensive device and/or method for preventing damage to the contact pins of an electrical component is needed for reducing manufacturing costs.

DISCLOSURE OF THE INVENTION

An apparatus having a thin metal frame has an opening and a protective rail on each end. Four guide posts extend from the lower surface of the frame to a plate which is retained on their ends. Each guide post has a spring to bias the plate away from the frame. The plate has a large number of pin holes in a custom pattern for a particular electrical component having straight, electrical contact pins.

The component is loaded into the apparatus by extending the pins through the opening and into the pin holes in the plate. The rails may be flexibly depressed or flexed outward to accommodate the component before snapping onto and around the ends of the component to fix it from movement relative to the apparatus. The guide posts extend beyond the tips of the pins to provide stand-off protection. The tips of the guide posts are placed in a socket and the assembly is pressed into the socket until the pins seat in it. As the pins are inserted into the socket, the plate is pressed toward the frame to collapse the springs. The apparatus is left permanently installed with the component in the module.

BRIEF DESCRIPTION OF THE DRAWINGS

FIG. 1 is a top view of an apparatus for protecting the pins of the connector of FIG. 3 and is constructed in accordance with the invention.

FIG. 2 is a side view of the apparatus of FIG. 1.

FIG. 3 is a side view of an electrical connector having pin contacts.

FIG. 4 is a side view of the apparatus of FIG. 1 mounted on the connector of FIG. 3 with a heatsink shown prior to assembly on a printed circuit board.

FIG. 5 is a side view of the apparatus of FIG. 1 mounted on the connector of FIG. 3 with a heatsink shown after assembly to a printed circuit board.

BEST MODE FOR CARRYING OUT THE INVENTION

Referring to FIGS. 1 and 2, an apparatus 11 having a body 13 and a pin protection plate 15. Body 13 is a thin frame which is preferably formed from spring steel or plastic. Body 13 comprises a generally rectangular platform 21 with a large, central rectangular opening 23. A protective rail 25 extends from each end of platform 21. When viewed from the side (FIG. 2), rails 25 have a C-shaped cross-section which face each other.

A guide post 31 extends from the lower surface of each corner of platform 21. Guide posts 31 are short, cylindrical members with pointed ends. Each guide post 31 extends through a corner of plate 15. Small stops (not shown) are located on the ends of guide posts 31 to retain plate 15 on guide posts 31. A compression coil spring 33 is wrapped around each guide post 31 to bias plate 15 away from body 13 and against the stops on guide posts 31. As shown in FIG. 2, plate 15 is parallel to platform 21 in normal use.

Like platform 21, plate 15 is also generally rectangular and has approximately the same dimensions as platform 21. In the embodiment of FIG. 1, plate 15 is formed with a large plurality of pin holes 35 in a custom pattern for a particular electrical component 41 (FIG. 3). For this particular embodiment, component 41 is shown with a pin-in-hole (PIH) packaging having a generally rectangular module body 43 and a plurality of straight, electrical contact pins 45 extending from its lower surface. However, apparatus 11 and its components may be formed and sized for components having may different configurations. Pins 45 are equal in number and identical in pattern to holes 35 in plate 15.

In operation (FIG. 4), component 41 is loaded into apparatus 11 by carefully extending pins 45 through central opening 23 and into pin holes 35 in plate 15. As apparatus 11 is mounted to component 41, rails 25 will flexibly depress or spring outward to accommodate the length of component 41 before snapping onto and around the ends of component 41 (FIG. 4). Alternatively, body 15 may be bowed or flexed to increase the distance between rails 25 until component 41 is seated therebetween. When rails 25 are released, they will spring back to their original shape to retain component 41 in a relatively tight fit between platform 21 and rails 25. Since pin holes 35 closely receive pins 45, component 41 is now fixed from movement relative to apparatus 11. When properly seated, only the tips of pins 45 will extend through pin holes 35 (FIG. 4). Guide posts 31 extend through plate 15 by a slightly greater distance to provide stand-off protection to pins 45.

As shown in the embodiment of FIGS. 4 and 5, a conventional heatsink 47 may be attached to component 41 in a routine manner either before or after it is loaded into apparatus 11. The assembly of apparatus 11 and component 41 is now ready to be mounted onto an electrical device such as printed circuit board 53 or a mating socket 51 on PCB 53. The pointed tips of guide posts 31 are placed in alignment holes (not shown) in an upper surface of socket 51. Next, the assembly of apparatus 11 and component 41 is pressed into socket 51 until pins 45 seat in mating holes (not shown) in socket 51 and PCB 53. As pins 45 are inserted into socket 51, plate 15 is pressed toward platform 21, thereby collapsing springs 33. When installation of component 41 in socket 51 is complete, plate 15 will very nearly abut platform 21 and apparatus 11 will be left permanently installed with component 41.

The invention has several advantages. A simple, inexpensive device and method for preventing damage to the contact pins of an electrical component is provided for reducing manufacturing costs. The device allows unskilled persons to install even expensive components with less likelihood of damaging the component.

While the invention has been shown or described in only some of its forms, it should be apparent to those skilled in the art that it is not so limited, but is susceptible to various changes without departing from the scope of the invention.

What is claimed is:

1. An apparatus, comprising:

a frame adapted to engage and retain an electrical component having contact pins;

a guide member mounted to and extending from the frame;

a plate mounted to the guide member and having a set of pin holes which are adapted to align with and receive the contact pins of the component; wherein the plate has an extended position spaced apart from the frame such that the plate and the guide member protect the contact pins from incidental contact, and a retracted position wherein the plate is adjacent to the frame such that the contact pins are exposed; and wherein the frame is a platform having a central opening for accommodating the contact pins of the component which extend through the opening and into the pin holes in the plate.

2. An apparatus, comprising:

a frame adapted to engage and retain an electrical component having contact pins;

a guide member mounted to and extending from the frame;

a plate mounted to the guide member and having a set of pin holes which are adapted to align with and receive the contact pins of the component; wherein the plate has an extended position spaced apart from the frame such that the plate and the guide member protect the contact pins from incidental contact, and a retracted position wherein the plate is adjacent to the frame such that the contact pins are exposed; and wherein the retention member extends from a first surface of the frame and the guide member extends from a second surface of the frame and faces opposite the first surface.

3. An apparatus, comprising:

a frame adapted to engage and retain an electrical component having contact pins, wherein the frame has a pair of rails located on opposite side edges of the frame, the frame being flexible to insert the component between the rails;

a guide member mounted to and extending from the frame;

a plate mounted to the guide member and having a set of pin holes which are adapted to align with and receive the contact pins of the component; and wherein the plate has an extended position spaced apart from the frame such that the plate and the guide member protect the contact pins from incidental contact and a retracted position wherein the plate is adjacent to the frame such that the contact pins are exposed.

4. The apparatus of claim 3 wherein the rails have a C-shaped cross-section for clamping the component to the frame.

5. An apparatus, comprising in combination:

an electrical component having contact pins;

a PCB having a set of pin holes which receive the contact pins;

a frame which retains the component and has an opening for accommodating the contact pins;

a guide post mounted to and extending from the frame into a mating hole in the PCB;

a plate mounted to the guide post and having a set of pin holes which align with and receive the contact pins of the component; and wherein the plate has an extended position spaced apart from the frame such that the plate and the guide post protect the contact pins from incidental contact prior to their insertion into the pin holes of the PCB, and, after installation, a retracted position wherein the contact pins protrude from the pin holes in the plate into the pin holes of the PCB.

6. The apparatus of claim 5 wherein when the plate is in the extended position, only a tip of each of the contact pins extends beyond the plate, and the guide post extends beyond the tips of the contact pins.

7. The apparatus of claim 5 wherein the frame has four corners, and wherein the guide post comprises a plurality of guide posts.

8. The apparatus of claim 5, further comprising a spring for biasing the plate away from the frame.

9. The apparatus of claim 5 wherein the frame is a generally flat platform and the opening is a central, rectangular opening the platform for allowing the contact pins to extend therethrough and into the pin holes in the plate.

10. An apparatus, comprising:

a platform adapted to engage an electrical component having contact pins, the platform having a central opening for allowing the contact pins to extend therethrough;

a retention member mounted to the platform and adapted to retain the component on the platform;

a plurality of guide members mounted to and extending from the platform;

a plate mounted to the guide members and having a set of pin holes which are adapted to align with and receive the contact pins of the component, the plate being substantially parallel to the platform;

a spring mounted to each guide member for biasing the plate to an extended position away from the platform; and wherein when the plate is in the extended position, the plate and no more than tips of the contact pins protrude through the pin holes of the plate, and when the plate is in a retracted position, the contact pins protrude further through the pin holes of the plate.

11. The apparatus of claim 10 wherein the retention member comprises a pair of rails located on opposite side edges of the platform, the platform being flexible to insert the component between the rails.

12. The apparatus of claim 11 wherein the rails have a C-shaped cross-section for clamping the component to the platform.

* * * * *